United States Patent
Federspiel (10) Patent No.: US 9,568,924 B2
(45) Date of Patent: Feb. 14, 2017

(54) METHODS AND SYSTEMS FOR COORDINATING THE CONTROL OF HVAC UNITS

(75) Inventor: Clifford C. Federspiel, El Cerrito, CA (US)

(73) Assignee: Vigilent Corporation, Oakland, CA (US)

( * ) Notice: Subject to any disclaimer, the term of this patent is extended or adjusted under 35 U.S.C. 154(b) by 0 days.

(21) Appl. No.: 13/549,879

(22) Filed: Jul. 16, 2012

(65) Prior Publication Data

US 2012/0283881 A1 Nov. 8, 2012

Related U.S. Application Data

(63) Continuation of application No. 12/396,944, filed on Mar. 3, 2009, now Pat. No. 8,224,489.

(60) Provisional application No. 61/149,273, filed on Feb. 2, 2009, provisional application No. 61/033,154, filed on Mar. 3, 2008.

(51) Int. Cl.
| | |
|---|---|
| G05B 13/00 | (2006.01) |
| G05B 15/00 | (2006.01) |
| G05D 23/19 | (2006.01) |
| F24F 11/00 | (2006.01) |
| G05D 22/02 | (2006.01) |
| H05K 7/20 | (2006.01) |

(52) U.S. Cl.
CPC ......... *G05D 23/1931* (2013.01); *F24F 11/006* (2013.01); *G05D 22/02* (2013.01); *H05K 7/20836* (2013.01)

(58) Field of Classification Search
CPC . F24F 11/0086; F24F 11/006; G05D 23/1931; G05D 22/02; H05K 7/20836
USPC .... 700/276–278, 299, 29; 165/201; 340/514
See application file for complete search history.

(56) References Cited

U.S. PATENT DOCUMENTS

| | | | |
|---|---|---|---|
| 4,215,408 A * | 7/1980 | Games et al. ............... 700/278 |
| 5,170,935 A * | 12/1992 | Federspiel et al. ......... 236/44 C |
| 5,464,369 A | 11/1995 | Federspiel |
| 5,550,752 A | 8/1996 | Federspiel |
| 5,768,121 A | 6/1998 | Federspiel |
| 5,862,982 A | 1/1999 | Federspiel |
| 5,875,109 A | 2/1999 | Federspiel |
| 5,920,478 A | 7/1999 | Ekblad et al. |
| 6,402,043 B1 | 6/2002 | Cockerill |
| 6,557,574 B2 | 5/2003 | Federspiel |
| 6,719,625 B2 | 4/2004 | Federspiel |

(Continued)

FOREIGN PATENT DOCUMENTS

| | | |
|---|---|---|
| EP | 0501432 | 9/1994 |
| WO | 2006/099337 | 9/2006 |

*Primary Examiner* — Mohammad Ali
*Assistant Examiner* — Ziaul Karim
(74) *Attorney, Agent, or Firm* — Kilpatrick Townsend & Stockton LLP; David B. Raczkowski (57) ABSTRACT

A control strategy for heating, ventilating, and air-conditioning (HVAC) units used to condition the environment in data centers and other commercial buildings such as retail stores with an open-plan design is provided to coordinate the operation of the actuators of the HVAC units. A supervisory controller receives feedback signals from a plurality of environmental sensors and uses a set of references values to determine control signals to the actuators of the HVAC units. A pseudoinverse of a transfer function matrix G may be used to determine the control signals from errors in the feedback signals relative to the reference signals.

25 Claims, 9 Drawing Sheets

(56) References Cited

U.S. PATENT DOCUMENTS

| | | | |
|---|---|---|---|
| 6,865,449 B2 | 3/2005 | Dudley | |
| 7,058,477 B1 | 6/2006 | Rosen | |
| 7,089,087 B2 | 8/2006 | Dudley | |
| 7,097,111 B2 | 8/2006 | Riley et al. | |
| 7,117,129 B1 | 10/2006 | Bash et al. | |
| 7,363,094 B2 | 4/2008 | Kumar | |
| 7,516,622 B2 * | 4/2009 | Gauthier et al. | 62/157 |
| 7,664,573 B2 | 2/2010 | Ahmed | |
| 7,839,275 B2 | 11/2010 | Spalink et al. | |
| 7,847,681 B2 * | 12/2010 | Singhal et al. | 340/514 |
| 7,956,719 B2 * | 6/2011 | Anderson et al. | 340/3.51 |
| 8,195,340 B1 * | 6/2012 | Haney et al. | 700/295 |
| 8,346,396 B2 * | 1/2013 | Amundson et al. | 700/276 |
| 8,374,725 B1 * | 2/2013 | Ols | 700/277 |
| 2001/0020644 A1 * | 9/2001 | Gauthier et al. | 236/11 |
| 2002/0020446 A1 | 2/2002 | Federspiel | |
| 2003/0064676 A1 | 4/2003 | Federspiel | |
| 2003/0102382 A1 * | 6/2003 | Gauthier et al. | 236/11 |
| 2003/0200050 A1 * | 10/2003 | Sharma | 702/132 |
| 2004/0079093 A1 * | 4/2004 | Gauthier et al. | 62/157 |
| 2004/0117330 A1 * | 6/2004 | Ehlers et al. | 705/412 |
| 2004/0253918 A1 * | 12/2004 | Ezell et al. | 454/239 |
| 2005/0278071 A1 * | 12/2005 | Durham, III | 700/276 |
| 2006/0116067 A1 | 6/2006 | Federspiel | |
| 2006/0130500 A1 * | 6/2006 | Gauthier et al. | 62/176.6 |
| 2006/0206291 A1 | 9/2006 | Bash et al. | |
| 2006/0234621 A1 | 10/2006 | Desrochers et al. | |
| 2007/0043478 A1 * | 2/2007 | Ehlers et al. | 700/276 |
| 2009/0001182 A1 * | 1/2009 | Siddaramanna et al. | 236/46 R |
| 2011/0161059 A1 | 6/2011 | Jain et al. | |

* cited by examiner

METHODS AND SYSTEMS FOR COORDINATING THE CONTROL OF HVAC UNITS

CROSS-REFERENCES TO RELATED APPLICATIONS

This application is a continuation of U.S. patent application Ser. No. 12/396,944, entitled "METHOD AND APPARATUS FOR COORDINATING THE CONTROL OF HVAC UNITS," by Clifford C. Federspiel, filed Mar. 3, 2009, which claims the benefit of and priority to U.S. Provisional Patent Application No. 61/033,154, entitled "METHOD AND APPARATUS FOR COORDINATING THE CONTROL OF HVAC UNITS," by Clifford C. Federspiel, filed Mar. 3, 2008, and U.S. Provisional Patent Application No. 61/149,273, entitled "METHOD AND APPARATUS FOR COORDINATING THE CONTROL OF HVAC UNITS," by Clifford C. Federspiel, filed Feb. 2, 2009, the entire contents of which are incorporated herein by reference.

BACKGROUND

The present invention relates to controls for heating, ventilating, and air-conditioning (HVAC) systems, and more specifically to controls for systems that have multiple HVAC units conditioning a common space.

Modern buildings typically use HVAC systems to control indoor temperature, pressure, ventilation rate, and other variables. In many cases, these buildings have open-plan construction in which an open space is temperature-controlled and humidity-controlled by multiple HVAC units. In some cases, these HVAC units are referred to as unitary systems because the heating, cooling, humidification, and fans reside in a single packaged unit.

One application of unitary equipment is for the cooling and humidity control of data centers. In this application, it is common to have many HVAC units deployed throughout the data center. They are often floor-standing units, but may be wall-mounted, rack-mounted, or ceiling-mounted. The HVAC units often provide cooled air either to a raised-floor plenum, to a network of air ducts, or to the open air of the data center. The data center itself, or a large section of a large data center, typically has an open-plan construction, i.e. no permanent partitions separating the air in one part of the data center from the air in another part.

Another application of unitary equipment is for the cooling and humidity control of commercial buildings such as retail stores. In this application, it is common to have many HVAC units deployed on the rooftop of the building. The HVAC units typically provide cooled air either to a network of air ducts or directly into the open area of the store. The building itself, or large sections of it, typically has an open-plan construction, with no permanent partitions separating the air in one part of the building from the air in another part.

HVAC units for open-plan spaces such as data centers or retail stores are typically operated with decentralized, stand-alone controls. In the case of the data center HVAC units, it is common for each unit to operate in an attempt to control the temperature and humidity of the air entering the unit from the data center. For example, an HVAC unit may contain a sensor that determines the temperature and humidity of the air entering the unit. Based on the measurements of this sensor, the controls of that HVAC will alter operation of the unit in an attempt to change the temperature and humidity of the air entering the unit to align with the set points for that unit.

Since it is common for these units to be located in close proximity, this operating strategy often causes one unit to fight against another, resulting in oscillating temperature and humidity. In some cases, one unit may be heating while another unit is cooling, thus causing a waste by simultaneously heating and cooling. This problem is compounded by sensor errors from unit to unit, by the fact that the units may be configured with different set points (e.g. temperature that is to be maintained), and by the fact that humidity control is coupled with temperature control.

In a retail store or other commercial building with rooftop units and open-plan construction, the situation is similar. The units are operated with standalone controls where each unit attempts to control the temperature measured by one sensor located in the store. Since the open-plan construction allows free flow of air between sensors, the operation of one unit is coupled to the operation of another unit. Problems such as close sensor or unit location, sensor errors, and differing setpoints for the HVAC units can cause instability and unit-to-unit heating and cooling at the same time.

An alternative approach for data centers is to control each unit based on a sensor located in the data center instead of a single sensor located in the unit. U.S. patent application 2006/0206291 A1 to Bash et al. describes a method for assigning multiple sensors in an open-plan data center to a set of actuators, where there are typically fewer actuators than sensors. Each actuator is controlled (i.e. whether to heat or cool) based on one control sensor that is chosen from a set of sensors assigned to that actuator. Although Bash provides options for selecting the one control sensor, similar problems of close sensor or unit location, sensor errors, and differing setpoints can cause instability and unit-to-unit heating and cooling at the same time.

Another problem with decentralized control of HVAC units in data centers, retail stores, and other open-plan buildings is that the control is not fault tolerant. If one HVAC unit or one of its final control elements fails, or if the HVAC unit is intentionally brought off-line, the controls of the other units have no way to compensate for the failed or stopped unit.

Therefore, it is desirable to provide methods and systems that account for the coupling between units and provide mechanisms for fault tolerance.

BRIEF SUMMARY

Embodiments of the present invention provide systems and methods for controlling environmental maintenance (e.g. HVAC units) modules using sensors. Overlapping sets of sensors may be used to control respective HVAC units to account for the coupling effects of multiple HVAC units on a common controlled space. Embodiments can also advantageously ensure that the spatial variation of the controlled environmental variables is minimized, thus increasing efficiency and providing a comfortable, uniform temperature for workers and consumers.

For example, environmental measurements (e.g. temperature, humidity, pressure) are received from the sensors. Error or difference values for each sensor are determined in relation to reference values (e.g. temperature settings). To maintain desired environmental settings, changes in an operational parameter (e.g. fan speed) of each module are calculated from contributions of respective difference values. In one aspect, a transfer matrix may be used to weight the difference values and then each contribution may be summed to obtain an overall change in the parameter. This may be done for each parameter of each module.

According to one exemplary embodiment, a method of controlling an environmental maintenance module using a plurality of sensors is provided. A first set of environmental measurements are received. Each environmental measurement is from a respective one of the sensors. Differences between the environmental measurements and a plurality reference values are determined. Each difference is between a respective environmental measurement and a corresponding reference value. A change value for an operational parameter of the environmental maintenance module is calculated. The change value includes contributions derived from at least two of the differences.

According to another exemplary embodiment, a system for controlling an environmental maintenance module using a plurality of sensors is provided. An input interface receives a first set of environmental measurements. Each environmental measurement is from a respective one of the sensors. One or more processors are configured to determine differences between the environmental measurements and a plurality reference values. Each difference is between a respective environmental measurement and a corresponding reference value. The one or more processors are also configured to calculate a change value for an operational parameter of the environmental maintenance module. The change value includes contributions derived from at least two of the differences. An output interface sends a new value for the operational parameter to the environmental maintenance module.

According to another exemplary embodiment, a method of controlling a plurality of environmental maintenance modules using a plurality of sensors is provided. A first set of environmental measurements are received. Each environmental measurement is from a respective one of the sensors. Differences between the environmental measurements and a plurality reference values are determined. Each difference is between a respective environmental measurement and a corresponding reference value. A first change value is calculated for an operational parameter for a first environmental maintenance module. The first change value includes a first contribution derived from the difference associated with a first sensor. A second change value is calculated for the operational parameter for a second environmental maintenance module. The second change value includes a second contribution derived from the difference associated with the first sensor, where the first contribution is different from the second contribution.

A better understanding of the nature and advantages of the present invention may be gained with reference to the following detailed description and the accompanying drawings.

DETAILED DESCRIPTION OF EXEMPLARY EMBODIMENTS

Embodiments provide systems and methods for controlling environmental maintenance (e.g. HVAC units) modules using sensors. To account for the coupling effects of multiple HVAC units on a common controlled space, the sensors may be composed of overlapping sets of sensors that are used to control respective HVAC units. Embodiments can also advantageously ensure that the spatial variation of the controlled environmental variables is minimized, thus increasing efficiency and providing a comfortable, uniform temperature for workers and consumers.

I. System

Figure 1:
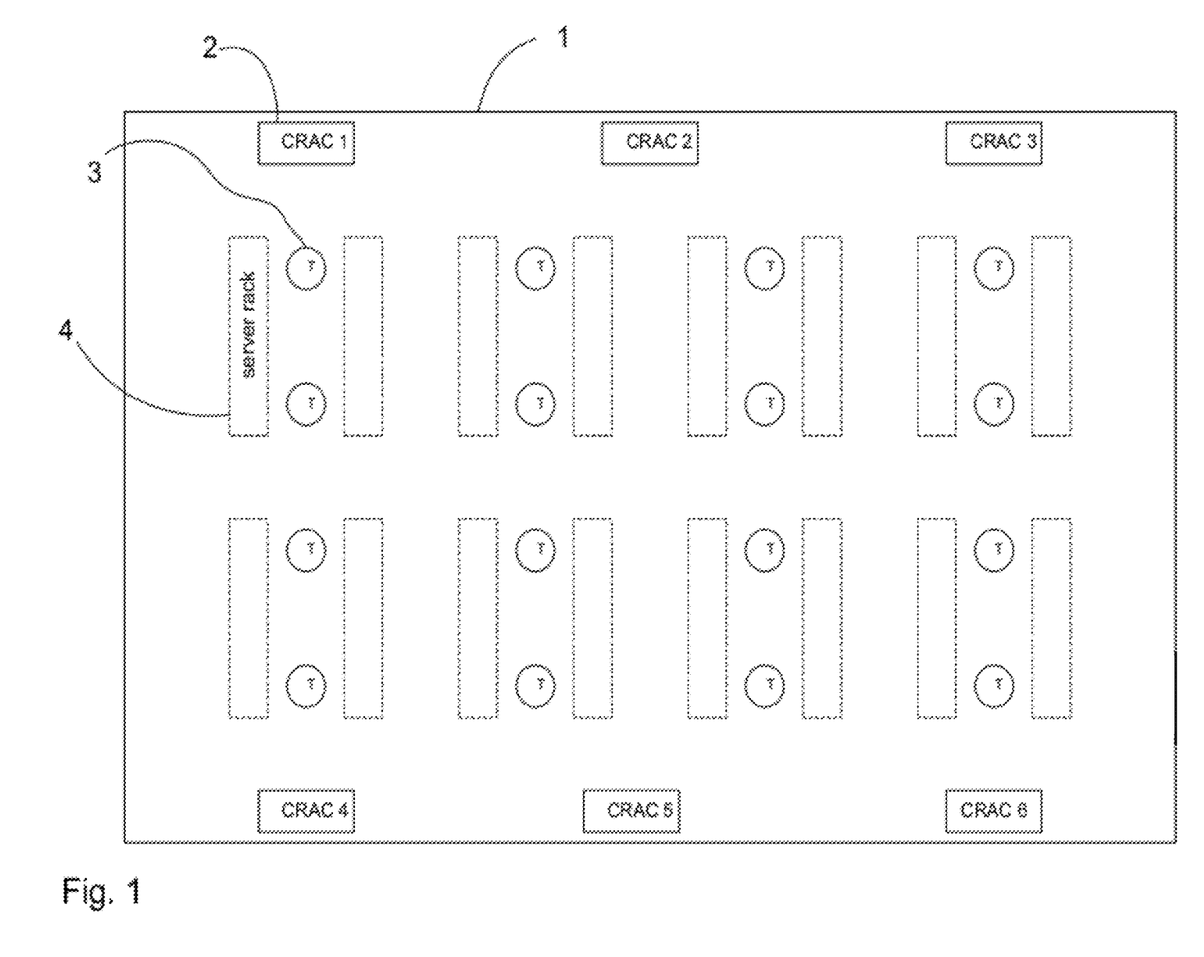
FIG. 1 is a plan view of a data center according to an embodiment of the present invention.

FIG. 1 shows a floor plan of a data center according to an embodiment of the present invention. Perimeter wall 1 may be the perimeter wall of a data center or the perimeter wall of a commercial building such as a retail store. A data center includes a plurality of HVAC units 2, a plurality of environmental sensors 3, and a plurality of server racks 4. As shown, the HVAC units are computer room air conditioner (CRAC) units.

In one embodiment, HVAC units 2 are unitary equipment that provide airflow to the data center to cool servers in server racks 4. In one aspect, HVAC units 2 can cool, heat, humidify, or dehumidify air that passes through them. Environmental sensors 3 are devices that measure environmental parameters, such as temperature or humidity. Environmental sensors 3 can transmit measurements (also called readings) by any means, such as by wired or wireless communication means (e.g., Wi-Fi, Wimax, Zigby, or any other applicable protocol).

Figure 2:
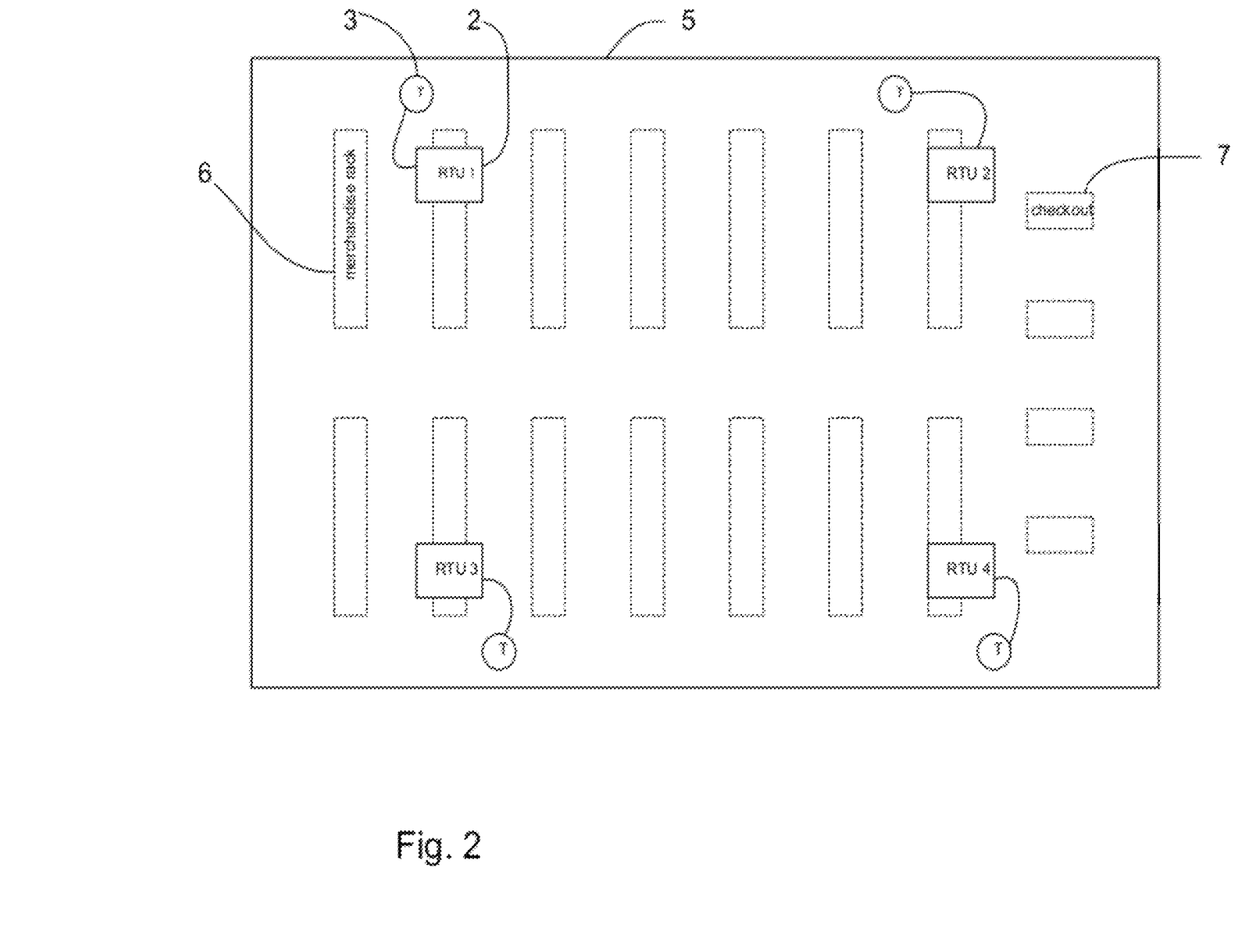
FIG. 2 is a plan view of an open-plan building conditioned by unitary rooftop units according to an embodiment of the present invention.

FIG. 2 is a plan view of an open-plan building conditioned by unitary rooftop units according to an embodiment of the present invention. In this example, the HVAC units are roof top units (RTU) 2. Perimeter wall 5 is an outside or inside wall of a commercial building such as a retail store or space within such a building or store. As depicted, a wired communication occurs between the RTU 2 and sensors 3 near that particular RTU, but wireless communications may also be used. Merchandise racks 6 and a store checkout counter 7 are also shown.

Figure 3:
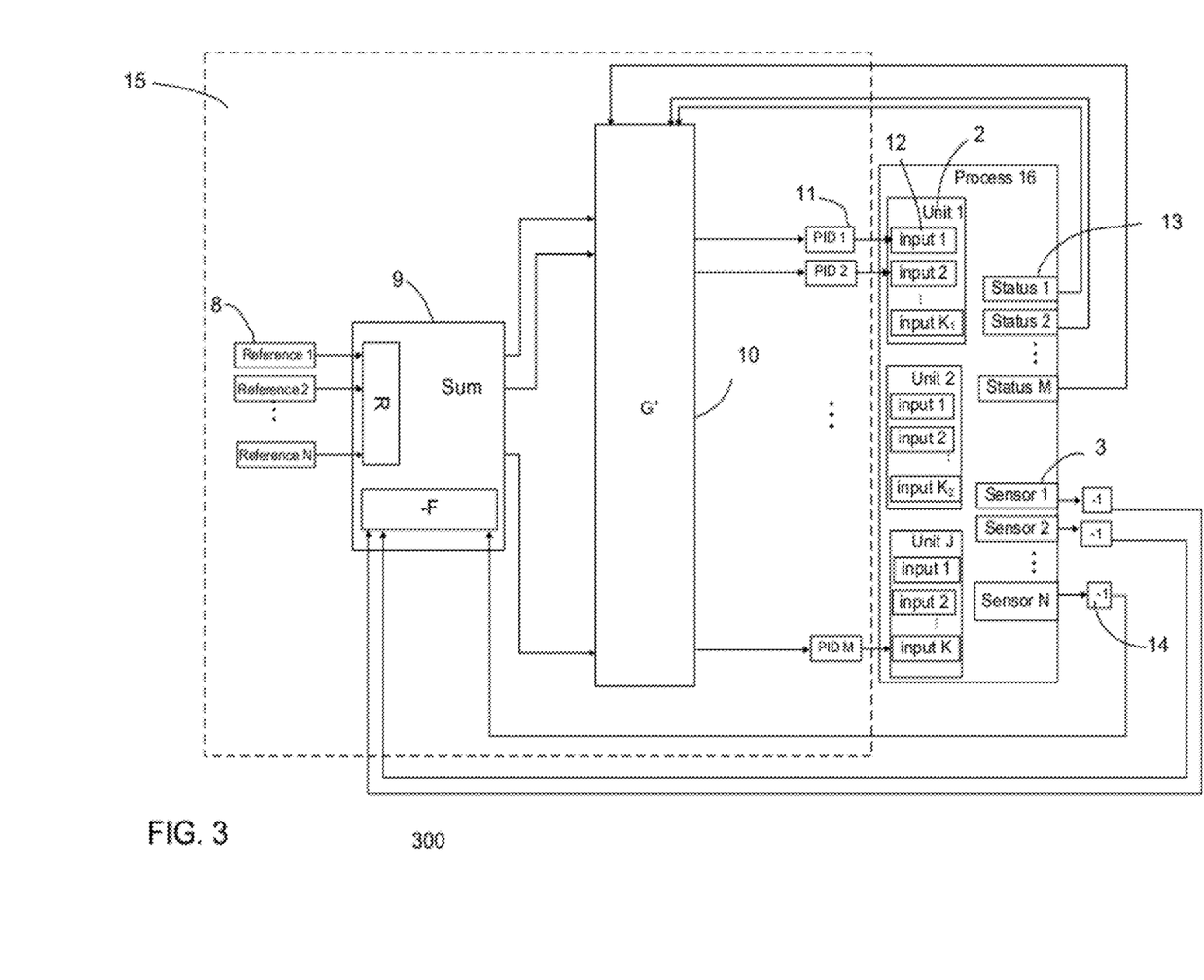
FIG. 3 is a block diagram of a control system 300 for providing maintenance of environmental conditions within a building according to an embodiment of the present invention.

FIG. 3 is a block diagram of a control system 300 for providing maintenance of environmental conditions with a building according to an embodiment of the present invention. In this example, control system 300 comprises HVAC units 2, a plurality of environmental sensors 3, and a supervisory controller 15. The HVAC units 2 include final control elements (also called actuators), e.g., for fans, valves, or temperature elements, which may be used in maintaining the environment of a space. In one aspect, the supervisory controller 15 controls the final control elements in a coordinated fashion such that an interactive coupling between the final control elements is compensated.

Hvac Units

The supervisory controller 15 coordinates the operation of multiple HVAC units 2 by computing commands to inputs 12 of each HVAC unit 2. The commands are computed based on the environmental sensor readings from the sensors 3. The inputs 12 may correspond to a variety of different HVAC units 2 and/or devices or circuits within the HVAC units 2.

In one embodiment, input 1 of HVAC unit 1 may correspond to the operational parameter of one actuator (e.g. for a cooling valve), and the input 2 of HVAC unit 1 may correspond to a different actuator of the same HVAC unit 1. In another embodiment, some of the HVAC units 2 have only one input.

In another embodiment, one input could be the setpoint for the temperature of an HVAC unit 2. For example, a setpoint may be the desired temperature of the air discharged by the HVAC unit 2, or the desired temperature of the air returning to the unit. Other inputs could be the setpoint for the humidity (or the humidifier command), or a command to a variable frequency drive (VFD).

In one embodiment, each HVAC unit has the same number of inputs, each corresponding to one actuator of that HVAC unit. In another embodiment, different HVAC units may have a different number of actuators. In such an embodiment, the number of sensors may stay the same even though some of the HVAC units have less functionality than other ones.

In part, a reason the number of sensors may stay the same is because the sensors may affect each actuator as explained herein. For example, a temperature actuator (e.g. cooling valve) can affect the humidity as may happen when condensate forms on the cooling coil if the environment is cold enough. Likewise, humidity actuators (e.g. infrared humidifiers and evaporative cooling valves) affect the temperature, as may happen when infrared humidifiers raise humidity or evaporative coolers raise humidity.

Sensors

Environmental sensors 3 send their readings back to supervisory controller 15, e.g., by wired or wireless communication means (such as Wi-Fi, Wimax, Zigby, or any other applicable protocol). Examples of sensors include temperature sensors, humidity sensors, and pressure sensors. The environmental sensors 3 may be positioned randomly or according to a regular pattern. The environmental sensors 3 may also be organized via clusters of sensors or individually placed.

In one embodiment, supervisory controller 15 causes environmental sensor readings F to be as close as possible to an associated set of reference values 8. In another embodiment, the supervisory controller 15 automatically compensates for failed HVAC units 2, failed final control elements, or intentionally stopped HVAC units 2.

In one embodiment, supervisory controller 15 internal stores the set of desired reference values 8 for each environmental sensor, e.g. in flash memory, cache, or other suitable memory. In other embodiments, the reference values 8 may be stored externally, e.g. in a disk drive or optical drive. In operation, supervisory controller 15 adjusts inputs of HVAC units 2 to keep the values from environmental sensors 3 close to their desired reference values 8.

In one embodiment, negation blocks 14 changes the sensor readings to have a negative value (e.g. by multiplying with −1). In this manner, to provide negative feedback, summation calculator 10 can take a sum instead of a subtraction to provide a difference between reference values 8 and the sensor readings.

Inputs to HVACs

In one embodiment, supervisory controller 15 computes commands that are provided to inputs 12 and are used directly for final control elements (e.g. actuators) in HVAC units 2. These commands sent to the inputs 12 may be provided, e.g., by wired or wireless communication means.

In another embodiment, supervisory controller 15 computes commands to the inputs 12 that are used by a local digital controller (e.g. having microprocessor-based controls) in an HVAC unit 2. In one aspect, each input to the local digital controller of a unit corresponds to an actuator of the unit. The local digital controller can then determine the final commands sent to the final control elements. For example, the local digital controller may convert a digital signal to an analog signal for the actuator, or convert a protocol of the signal to be usable by an actuator.

The local digital controller may also operate to maintain an actuator at a particular setting though a local control loop. Thus, supervisory controller 15 may command the setpoints of local control loops in the local digital controllers rather than directly commanding the final control elements.

Status Indicators

In one embodiment, supervisory controller 15 has means of receiving status indicators 13 from the environmental sensors 3 and/or the HVAC units 2. The status indicators 13 provide information as to whether an HVAC unit 2 or a sensor 3 is presently operational. The status indicators 13 are shown separated from the HVAC units 2 and sensors 3 for illustrative purposes.

In one embodiment, the status indicators 13 for the HVAC units 2 may be obtained from local digital controllers of the HVAC units 2. These local digital controllers can be queried by supervisory controller 15 to determine if the local digital controllers or the HVAC units 2 are "on" or "off". If a unit is "off", then the status indicator 13 for that unit's actuators would be, e.g., zero.

In another example, the environmental sensors 3 have some well-defined and easily detected failure modes. In one aspect, one failure mode is an "unreachable", which means that a gateway, e.g. a network interface of the supervisory controller 15, cannot communicate with the sensor. Another failure mode is an out-of-range voltage (either 0 volts or 1.5 volts), where 0 volts implies that the sensor probe has a short circuit and 1.5 volts indicates that the sensor probe has an open circuit or is missing. Any of these failures may result in a status indicator of zero for that sensor.

II. Translating Feedback Errors to Control Errors

Figure 4:
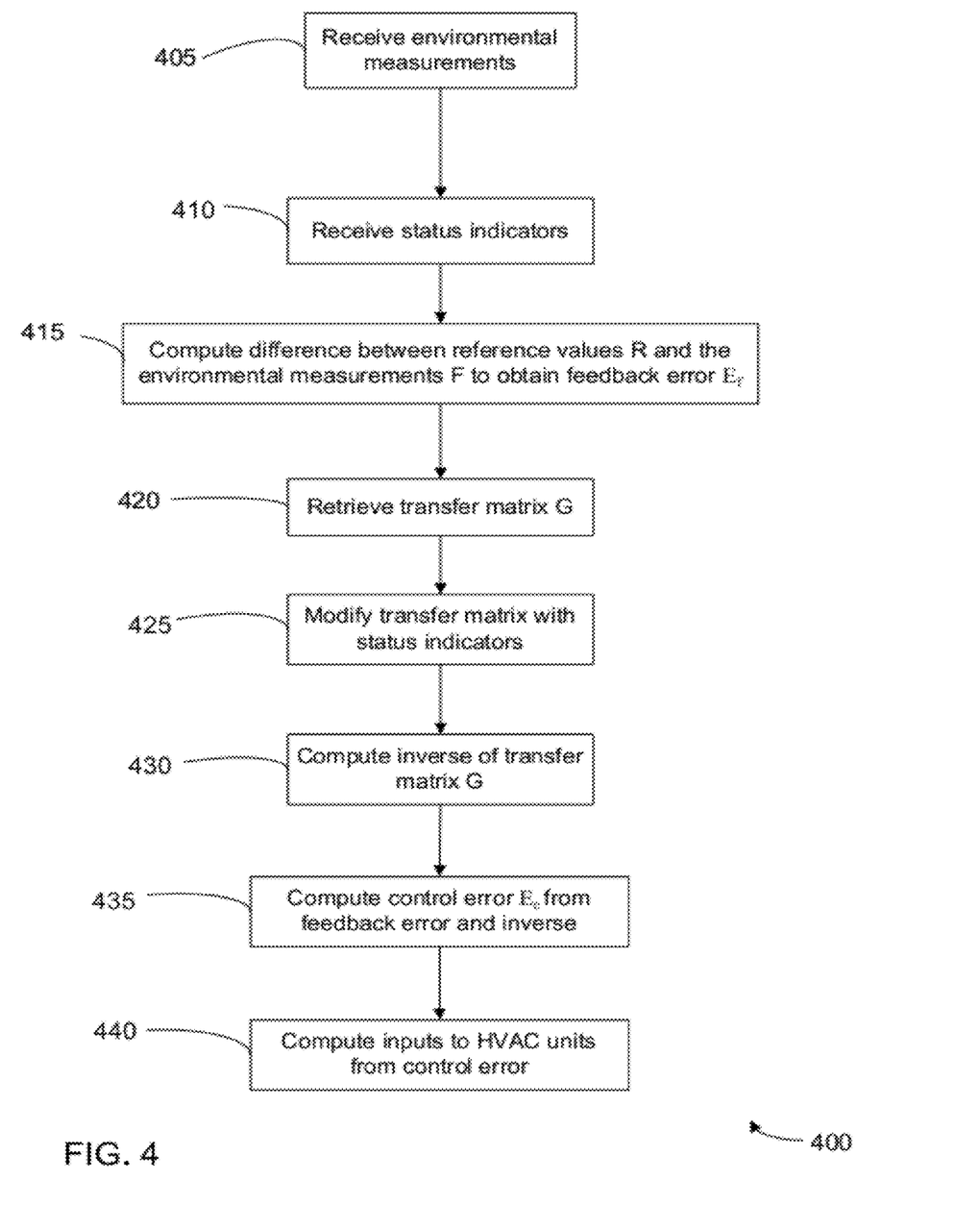
FIG. 4 is a flow diagram illustrating a method of controlling environmental maintenance modules according to an embodiment of the present invention.

FIG. 4 is a flow diagram illustrating a method 400 of controlling environmental maintenance modules (e.g. HVAC units) according to an embodiment of the present invention. In describing the method, reference will be made to FIG. 3.

In step 405, the supervisory controller 15 acquires values F from environmental sensors 3. The F values are readings from the environmental sensors 3. F may be viewed as a vector, with each element corresponding to a different reading. Note that sensors of different types may be packaged as a single unit, but are still different sensors.

In step 410, the supervisory controller 15 acquires status values from the status indicators 13. For example, the status values may be received by a pseudoinverse calculator 10. In one embodiment, the status indicators 13 are outputs of logical operations, as may result from digital and/or analog data being processed to determine whether or not a sensor or actuator is working.

In step 415, supervisory controller 15 computes the respective difference between the desired reference values R and the corresponding values F from environmental sensors 3. In one embodiment, a summation calculator 9 of the supervisory controller 15 is used to perform the difference calculation. Inputs to summation calculator 9 are desired reference values 8 and outputs from environmental sensors 3. In one aspect, the calculation is performed as follows:

$$E_f = R - F \quad (1)$$

where $E_f$ is the feedback error, R is a vector of desired reference values 8, and F is a vector of the corresponding readings from environmental sensors 3. Outputs of summation calculator 9 are input to pseudoinverse calculator 10.

In step 420, a transfer matrix G is retrieved, e.g., from a local or external (e.g. networked) memory. G is a matrix of values that relate inputs to process 16 (e.g. inputs 12) to outputs of process 16 (e.g. outputs of sensors 3). In one aspect, the element in the ith row and jth column of G is the transfer function relating the jth final control element to the ith sensor.

In one embodiment, each matrix element is a function (e.g. a LaPlace transform). In another embodiment, the matrix element is a number (e.g. the value of the LaPlace transform when s=0). In one aspect, using numbers provides static decoupling.

In one embodiment, the values of G are equal to the change in the ith environmental sensor reading divided by the change in the jth final control element value. For example, the element of G at the ith row and jth column may be the ith output divided by the jth input.

In general, G is frequency dependent. In one embodiment, the values of G at or close to steady state (zero frequency), also called "quasi-steady," are used. A method of creating G is described below in FIG. 8.

In step 425, the transfer matrix G is optionally modified based on the status indicators. In an embodiment, G is multiplied element-by-element by the status matrix, S, which has the same dimension as G but contains information about the status of each final control element.

$$G_s = G.*S \quad (2)$$

where the ".*" operation signifies element-by-element multiplication.

In one embodiment, the status matrix, S, is an incidence matrix with values of unity for every element (i.e. every sensor that is working) of every column if the corresponding final control element is operational. If an HVAC unit 2 is "off", then the columns of S corresponding to the final control elements of that unit are zero. If a sensor is "off", then the row of S corresponding to that sensor are zero. One skilled in the art will recognize that the appropriate elements of G may be zeroed in any number of ways.

Accordingly, embodiments can advantageously compensate for failed or shut-down units automatically. In particular, embodiments provide a control strategy that can account for the effects of multiple HVAC units on a common controlled space when one or more HVAC units 2 have been taken off-line or has failed.

In step 430, an inverse (such as an exact inverse, pseudo-inverse, or Moore-Penrose pseudoinverse) of $G_s$ is computed. In one embodiment, this is calculated by singular value decomposition of $G_s$. The singular value decomposition of $G_s$ is computed as follows:

$$G_s = U \Sigma V^* \quad (3)$$

where U is the matrix of left singular vectors, $\Sigma$ is the diagonal matrix of singular values, V is the matrix of right singular vectors, and $V^*$ is the conjugate transpose of V. The pseudoinverse of $G_s$ may be computed as follows:

$$G_s^+ = U^* \Sigma^+ V \quad (4)$$

where $U^*$ is the conjugate transpose of U, and $\Sigma$ is the transpose of $\Sigma$ with every nonzero entry replaced by its reciprocal. In one embodiment, if a nonzero entry of $\Sigma$ is smaller than a threshold, then that element of $\Sigma^+$ is set to zero.

In another embodiment, the computing of the pseudoinverse uses QR factorization.

If values from status indicators 13 have changed, or if a condition has been reached that causes values of the transfer function matrix, G, to change, then supervisory controller 15 may re-compute the pseudoinverse of G with pseudoinverse calculator 10.

In step 435, supervisory controller 15 computes the control error $E_c$ as the product of the pseudoinverse and the feedback error as follows:

$$E_c = G_s^+ E_f \quad (5)$$

$E_c$ is the calculated error (an example of a change value) in an operational parameter (such as a setpoint, digital control value, or analog command signal) for each of the final control elements of each of the HVAC units 2.

In step 440, the supervisory controller 15 computes the new inputs of each HVAC unit 2. In some embodiments, the values for $E_c$ may be added (or subtracted as the case may be) from the old operational parameters to create new operational parameters. These new operational parameters may be taken as is and used for the inputs 12 into the HVAC units.

In other embodiments, the new operational parameters may be combined with previously calculated operational parameters in order to determine the new inputs. In one embodiment, this combination of operational parameters from previous iterations is performed by a proportional-integral-derivative (PID) object 11 operating on each value of the control error $E_c$. In FIG. 3, $E_c$ is the input to the bank of PID objects 11. In one aspect, a PID object 11 is a control loop feedback mechanism. The PID object 11 attempts to correct the particular control error $E_c$ by calculating and then outputting a corrective action that can adjust the process (e.g. process 16) accordingly.

In one embodiment, a PID object 11 calculates three separate parameters: the proportional, the integral and derivative values. The proportional value determines the reaction to the current error, the integral determines the reaction based on the sum of past errors, and the derivative determines the reaction to the rate at which the error has been changing. The weighted sum of these three actions is used to adjust the process 16 via a final control element, such as the position of a control valve or the power supply of a heating element, or to reset a setpoint of an embedded (local) digital controller of an HVAC unit.

For example, the setpoint may be the desired return air temperature of a computer room air handling unit or the desired discharge air temperature of a computer room air handling unit. In embodiments, the digital controller may set any one or more of the value of the chilled water valve, the value of a reheat coil, a humidifier, and a variable frequency drive for a motor.

By "tuning" the three constants in the PID object algorithm, the PID object 11 can provide control action designed for specific process requirements. For example, the response of the PID object 11 can be described in terms of the responsiveness of the PID object 11 to an error, the degree to which the controller overshoots a setpoint, and the degree of oscillation of the process being controlled.

In an embodiment, an integrator anti-windup feature resets the integral term so that the output of the PID object 11 equals the maximum output (typically 100%) or the minimum output whenever the control action is "pushing" the output against the limit. In another embodiment, a deadband feature sets the error to zero when it is close to zero. This deadband feature is used to prevent control changes due to noise or other small perturbations in the error that aren't important. In yet another embodiment, a rate constraint feature prevents the output of the PID object 11 from changing faster than a user-defined rate, which may act in a similar fashion to non-linear damping. In yet another embodiment, an auxiliary output feature enables feedforward control.

More Sensors than Actuators

In embodiments used for data-center control, there will generally be more sensors 3 (outputs) than actuators (e.g. cooling valves and humidifiers). Here, the pseudoinverse $G_s^+$ is used to solve a least-squares problem. In one aspect, using the pseudoinverse $G_s^+$ results in a temperature distribution that has the smallest mean squared deviation from the reference values, R, at steady-state. Accordingly, embodiments can advantageously produce the control actions that result in feedback errors $E_f$ that are minimized in the least-squares sense.

Fewer Sensors than Actuators

In another embodiment, there are fewer sensors 3 than actuators. Then, the transfer function matrix G has more columns than rows, and the pseudoinverse $G_s^+$ is not unique. In one aspect, computing G using the singular value decomposition is not only numerically robust, but also produces a "minimum norm" solution that will produce actuations that are all about the same magnitude rather than some at 100% and others at 0%. Such operation can provide increased efficiency as for many kinds of HVAC equipment. For example, it is more efficient to operate redundant actuation mechanisms (e.g., fans operating in parallel) at the same level.

Effect of Status Matrix

In embodiments using the status indicators 13, the status indicators 13 tell the system whether or not an actuator or sensor is working. If an actuator is not working, either because of a failure or because it has been taken offline or because of physics (e.g., cooling coil not cold enough to dehumidify), then the column of G for that actuator should be set to zero and the pseudoinverse recomputed. The controls will then move the temperature distribution to the new least squares feedback error given that the actuator can't be used to change the temperature distribution. If a sensor fails, then the corresponding row of G can be zeroed out and the pseudoinverse recomputed. This zeroing will have the effect of making the system not care about the temperature at the location of the failed sensor.

III. Translating Feedback Values to Control Values

In certain situation of G having zero or near zero singular values, problems can arise. One embodiment solves such problems by using a pseudoinverse of a reduced-order transfer function matrix $(G_r)$.

Problem of Zero or Near Zero Singular Values of G

In one embodiment, the dimension of the control errors $E_c$ equals the number of actuators. Each control error is input to a PID object 11. Due to redundancy or partial redundancy, particularly in combination with measurement noise during the functional test used to determine G, it is possible for this technique to produce undesirable results. For example, suppose that the transfer function matrix is the following:

$$G = \begin{bmatrix} 0.5 & 0.5 \\ 0.33 & 0.33 \\ 0.25 & 0.25 \end{bmatrix}.$$

Since there are two columns, this G corresponds to a transfer matrix for two actuators. Since there are three rows, this G corresponds to a transfer matrix for three sensors. Thus, for this G, each of the actuators has an equal effect on a respective sensor.

In this case one of the singular values of G is zero (G has rank of 1), and the psuedoinverse is as follows:

$$G^+ = \begin{bmatrix} 0.59 & 0.39 & 0.30 \\ 0.59 & 0.39 & 0.30 \end{bmatrix}$$

The problem in this case is that feedback loops, each potentially with an integrator (one corresponding to each row of G+) will be competing for control of one state variable. The problem gets considerably worse if G is not quite singular. Consider the following modified transfer function matrix:

$$G = \begin{bmatrix} 0.5 & 0.45 \\ 0.33 & 0.33 \\ 0.25 & 0.25 \end{bmatrix}$$

In this case, the singular values are 0.89 and 0.023, so G has full column rank. However, the psuedoinverse is quite different:

$$G^+ = \begin{bmatrix} 20 & -17.3 & -13.1 \\ -20 & 19.3 & 14.6 \end{bmatrix}$$

Recall that $G^+$ translates feedback errors $E_f$ to control errors $E_c$. Suppose that the entire datacenter is hot by one degree. This means that all three feedback errors ($E_f$) will equal −1 ($E_f=[-1\ -1\ -1]^T$), and the control errors will be the product of $G^+$ and $E_f$, which gives the following result:

$$E_c = \begin{bmatrix} 10.5 \\ -13.8 \end{bmatrix}$$

In other words, the controls will drive the two actuators in opposite directions even though all of the temperatures are too high by the same modest amount.

In one aspect, we can partially fix this problem by setting the small singular value to zero. This will result in a "rank-corrected" transfer function matrix ($G_c$). The pseudo-inverse of the rank-corrected transfer function matrix will be as follows:

$$G_c^+ = \begin{bmatrix} 0.62 & 0.43 & 0.33 \\ 0.58 & 0.40 & 0.30 \end{bmatrix}$$

This gets us back to a situation similar to the first example, where we will get two control errors of about the same size (an improvement), but we will still have two integrators competing for (approximately) one state variable. Embodiments provide a solution that produces an inverse that has the same number of rows as there are "significant" singular values.

Computing a Reduced-Order Pseudoinverse

Figure 5:
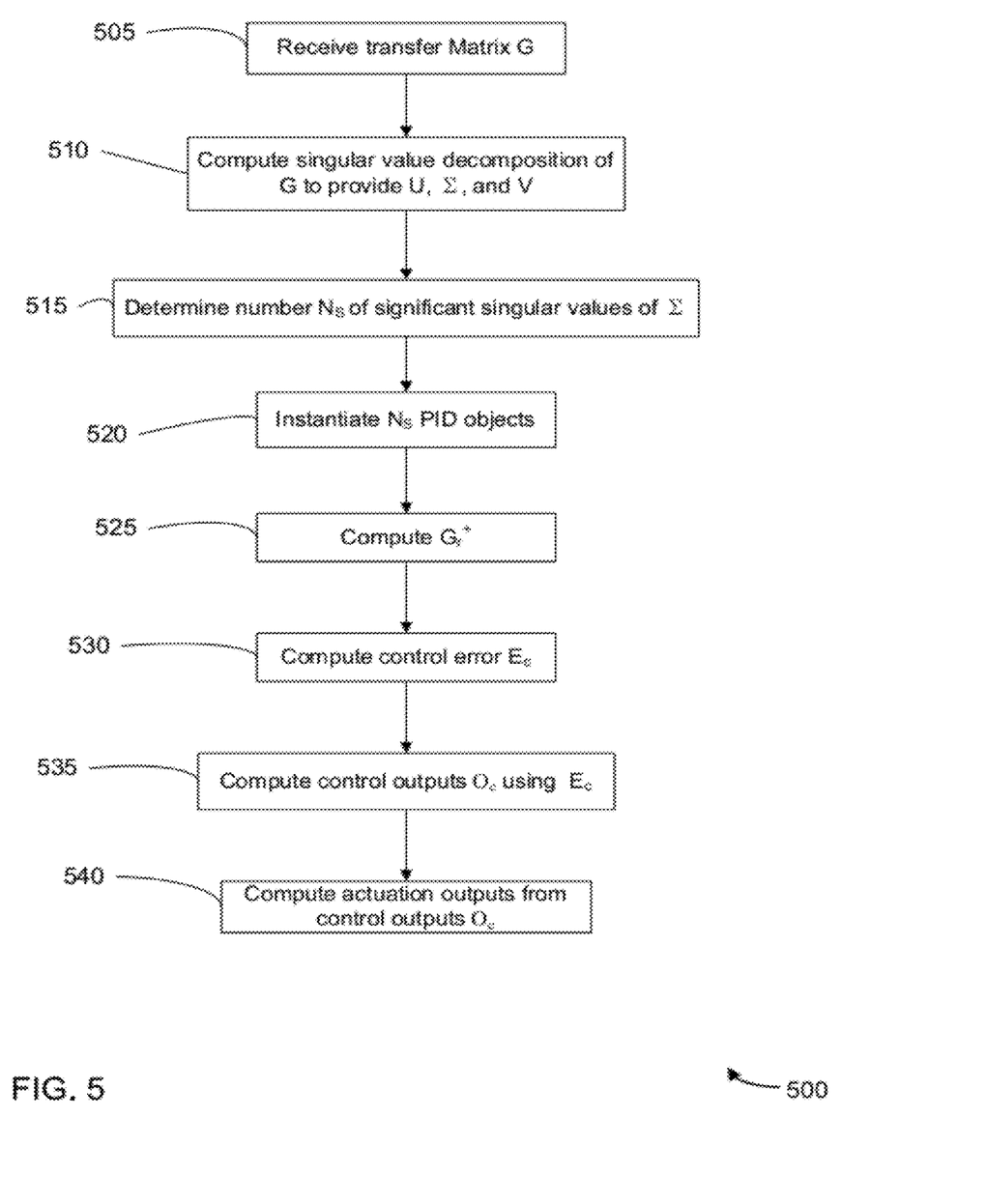
FIG. 5 is a flowchart illustrating a method 500 of controlling environmental maintenance modules having a similar effect on a set of sensors according to an embodiment of the present invention.

FIG. 5 is a flowchart illustrating a method 500 of controlling environmental maintenance modules having a similar effect on a set of sensors according to an embodiment of the present invention. In one aspect, method 500 may be implemented with the supervisory controller 15 of FIG. 3, or another processor. When a near zero singular value is encountered in the transfer matrix G, this embodiment provides an efficient control by computing a reduced-order pseudoinverse ($G_r^+$).

In one embodiment, $G_r^+$ is computed by taking the pseudoinverse of the transfer function matrix G times the right singular vector(s) corresponding to the "significant" singular values.

$G_r^+$=pinv($GV_r$), where $V_r$ is the matrix of right singular vectors corresponding to significant singular values. For the case above, $G_r^+$=[−0.85 −0.59 −0.44]. This reduced pseudoinverse has just one row, so the feedback loop of this example will have just one integrator, the same as the effective rank of G.

In step 505, a transfer function matrix (G) is received, e.g., in a database. In one aspect, this is a commissioning/engineering step that is accomplished by perturbing the actuation of each CRAC unit to determine its effect on the sensors, which is described in more detail below in FIG. 8.

In step 510, the singular value decomposition of G is computed, thereby returning U, Σ, and V. U is the matrix of left singular vectors, Σ is the diagonal matrix of singular values, V is the matrix of right singular vectors.

In step 515, a number of significant singular values, $N_s$, is determined. $N_s$ may be determined via any suitable method.

In one embodiment, singular values that exceed a threshold, such as a pre-specified fraction (e.g., 20%) of the largest singular value, may be selected. An advantage of this method is that it is simple. A disadvantage is that there is no good rule for picking the percent threshold.

Another embodiment chooses the largest singular values of G that result in a $G_r^+$ that has row sums (a sum of all of the elements of a row) all with the same sign. These singular values also correspond to the column sums of U all with the same sign. An advantage of this embodiment is that there is a physical interpretation to the threshold. The threshold is the level that (just) moves all actuators in the same direction when all feedback errors are the same.

Yet another embodiment chooses the largest singular values of G that result in a $G_r^+$ with all elements the same sign (or all elements of U the same sign). This method has the same advantages of the second method. It may have a disadvantage of being too aggressive, as it may result in a selection of very few (maybe just one) significant singular values.

Figure 6:
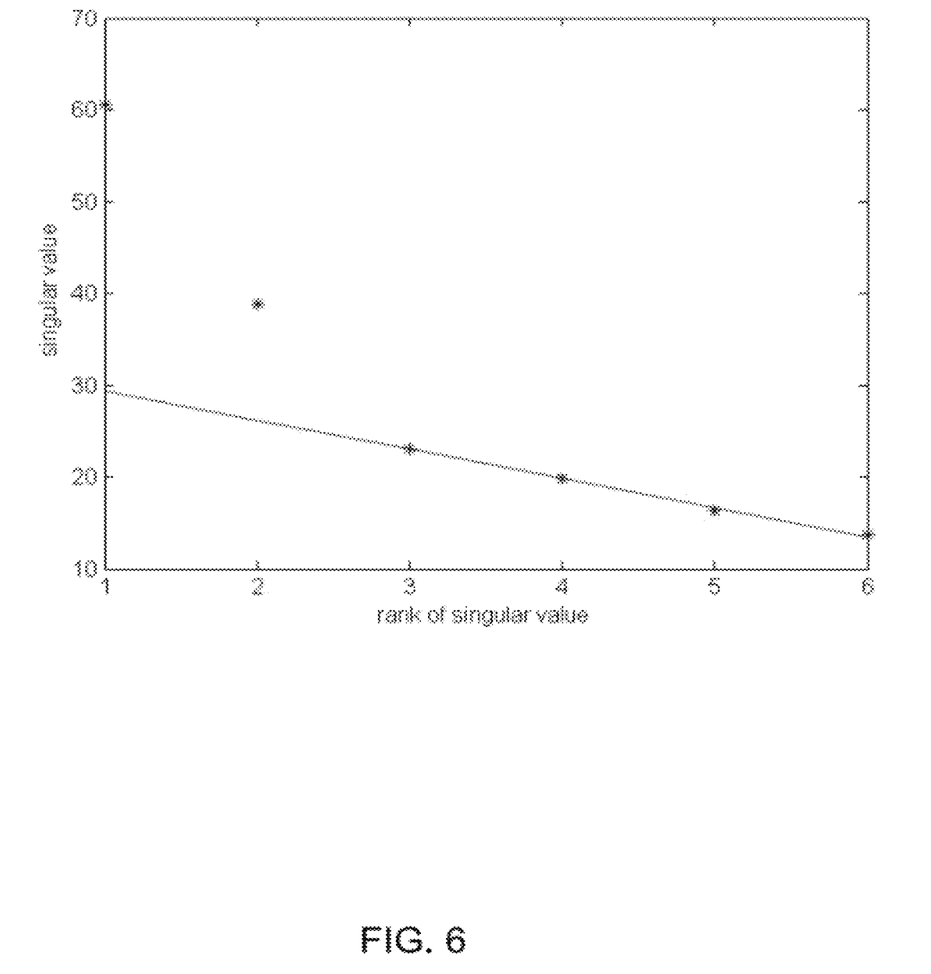
FIG. 6 shows the singular values for a system that has six actuators according to an embodiment of the present invention.

Yet another embodiment fits a line to the largest singular values of G as a function of their rank order, and select the largest singular values that do not fit the line. This selection can either be made manually, or it can be automated using an outlier detection method. FIG. 6 shows the singular values for a system that has six actuators. The linear regression clearly shows that just two of the singular values (first and second) are significant.

In step 520, $N_s$ PID objects are instatiated or otherwise selected for operation. These $N_s$ PID objects will calculate control values corresponding to each of the significant singular values. As such, the $N_s$ PID objects will not be competing against each other.

In step 525, $G_r^+$ is computed. In one embodiment, it is not necessary to recompute $G_r^+$ from scratch. The singular value decomposition results of G can be used to compute $G_r^+$. Since $GV_r$=UΣ, then $G_r^+$=$\Sigma_r^{-1}U_r^T$, where $\Sigma_r^{-1}$ is the inverse of the diagonal matrix of significant singular values, and $U_r^T$ is the transpose of the left singular vectors of G that correspond to the singular values in $\Sigma_r$.

In one embodiment, $\Sigma_r$ and $U_r$, the diagonal matrix of significant singular values and the matrix of left singular vectors corresponding to the significant singular values, are determined, for example by the pseudoinverse calculator 10 or another processor or part of a processor. The inverse of $\Sigma_r$ may be taken, e.g., by taking the inverse of each diagonal matrix element (i.e. significant singular value), to obtain $\Sigma_r^{-1}$.

In step 530, control error, $E_c$, is computed, where $E_c$=$G_r^+E_f$, and $E_f$=R−F. R is the reference value for each sensor, and F is the feedback from each sensor. In one embodiment, the control error can be computed by computing $E_f$ first. In another embodiment, r=$G_r^+$R and y=$G_r^+$Y may be computed, and then the difference, r−y, may be taken.

In step 535, the control outputs $O_c$ are computed by the $N_s$ PID objects, i.e. $O_c$=PID($E_c$). These PID objects may calculate the $O_c$ as described herein or known to one skilled in the art.

In step 540, the actuation output $O_a$ are computed from the control outputs $O_c$. In one aspect, since the system has more actuators than significant singular values (and therefore PID objects), the output of the single PID object is divided among the two actuators.

In one embodiment, the formula $O_a$=$V_rO_c$ is used. In other words, the outputs of the PID object is multiplied by the right singular vector(s) corresponding to the significant singular values. If the PID object is a pass-through (proportional gain=1, integral gain=derivative gain=0), then the command to the two actuators of the example above will be $$u = V_r G_r^+ E_f = \begin{bmatrix} 0.62 & 0.43 & 0.33 \\ 0.58 & 0.40 & 0.30 \end{bmatrix} E_f,$$

for the above mentioned example. The values in this matrix provides the psuedoinverse ($G_c$) of the "rank-corrected" transfer function matrix, but by only using with just one integrator, not two, in the feedback loop.

V. Calculating the Transfer Matrix G

It is possible that the actuation outputs, $O_a$, will be greater than or less than the allowable outputs of the physical devices (e.g., a valve cannot be more than 100% open). In this embodiment, the values of $O_a$ are constrained, and then the values of the integrators of the PID objects are reset so that the integrators don't "wind up". This constraint mechanism may be combined with any method mentioned herein.

Figure 7:
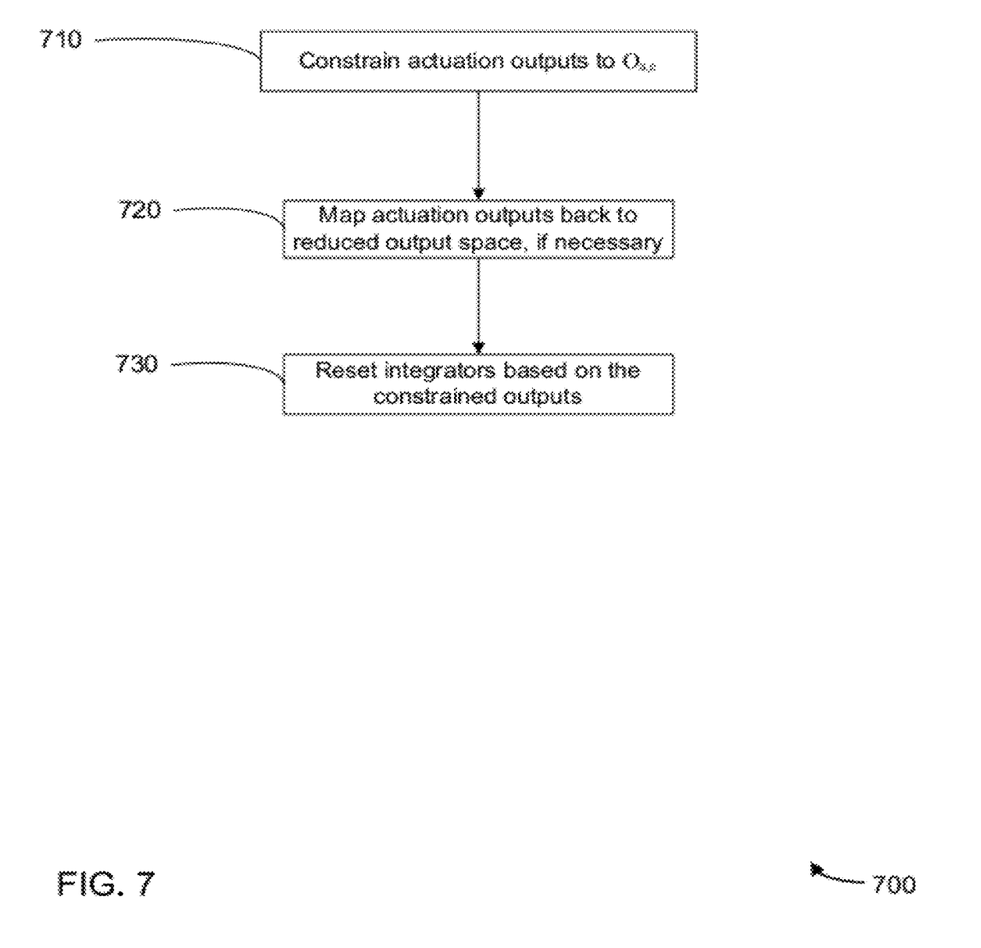
FIG. 7 is a flowchart illustrating a method 700 for constraining the values input into the actuators according to an embodiment of the present invention.

FIG. 7 is a flowchart illustrating a method 700 for constraining the values input into the actuators according to an embodiment of the present invention.

In step 710, the actuation outputs are constrained to $O_{a,c}$. In one embodiment, the constraints are maximum and/or minimum values for each actuator.

In an embodiment, a way to constrain the actuation outputs is to fit a line between the previous actuation output vector and the present actuation output vector, and compute the point along the line between them that is at the allowable boundary. The allowable boundary may be any function or shape, and can take account of appropriate values for each actuator.

In another embodiment, another way to constrain the outputs to the final control element is to simply limit the element(s) of $O_a$ to the minimum and maximum allowable values (e.g., 0% and 100%). For example, the value may be for a setting or an actual voltage level. The minimum and maximum allowable values may be chosen based on how the final control element operates. For example, for a valve, they will typically be 0% and 100%, but for a variable frequency drive, the minimum will typically be higher (e.g., 50%) in order to always keep some air moving.

In one embodiment, the constraints are dependent on another variable if the actuation outputs are setpoints. For example, if the supervisory controller 15 resets the return air temperature setpoint of the embedded controller in a computer room air handling unit, the return air temperature setpoint may need to constrained when the chilled water valve is fully closed or fully open, not when the limit of a setpoint range specified by software or by the air handling unit manufacturer is reached. This is because the air handling unit may not be able to achieve extreme setpoints even though them software and the equipment firmware permit them as valid.

In step 720, for embodiments where a reduced-order pseudoinverse ($G_r^+$) is used, the constrained actuation outputs $O_{a,c}$ are mapped back to the reduced output space $o_{c,c}$. In one embodiment, $V_r$ is used to map the constrained outputs into the control output space. For example, once the $O_a$ has been constrained to $O_{a,c}$, $O_{a,c}$ may be mapped back to the reduced output space as follows: $o_{c,c}=V_r^T O_{a,c}$, where $O_{a,c}$ is the vector of constrained actuation outputs. In one aspect, the actuation outputs $O_{a,c}$ are effectively mapped back onto the output range of the PID objects.

In step 730, the PID objects are reset based on the mapped (if necessary) and constrained outputs. The mapping of $O_a$ into the control output space is used to reset the integrators of the PID objects. In one embodiment, the PID objects are reset so that output values previous to the reset are not used in determining future output values. In other words, the PID object may be reset to start at a first iteration.

V. Calculating the Transfer Matrix G

Figure 8:
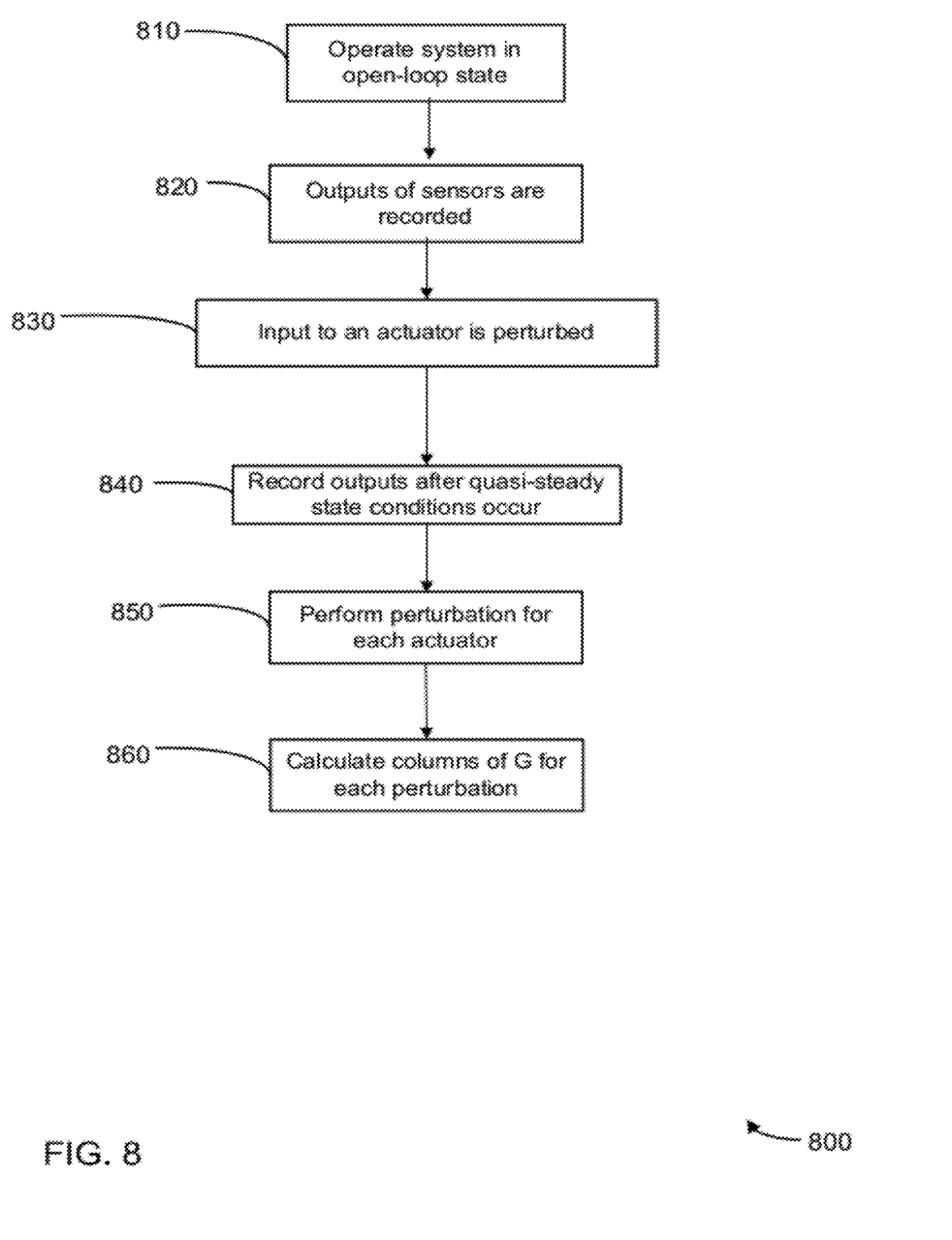
FIG. 8 is a flowchart illustrating a method 800 for calculating the transfer matrix G at quasi-steady conditions according to an embodiment of the present invention.

FIG. 8 is a flowchart illustrating a method for calculating the transfer matrix G at quasi-steady conditions according to an embodiment of the present invention.

In step 810, the system is operated in an open-loop state, e.g. each actuator is run at a constant value. In one embodiment, all of the actuators of a same type (e.g. a fan) are run at a same setting (e.g., all blowers at 100% rotational speed). In another embodiment, all of the actuators are run at the same setting.

In step 820, the outputs (e.g. temperatures and humidities) of the sensors 3 are recorded at this quasi-steady state condition. Quasi-steady state refers to the fact that the sensors may not be constantly reading a same value, e.g., due to random fluctuations in the environment or the electrical circuits of the sensors themselves.

In step 830, one of the inputs 12 (actuators) is perturbed by some amount (say, 20%). In this manner, the contribution to G of the actuator whose input is perturbed may be calculated.

In step 840, after quasi-steady state conditions occur, then the outputs are recorded again. Any suitable criteria for determining when a quasi-steady state condition occurs may be used. For example, the changes outputs of the sensors may have a certain rate of change after the perturbation. Once the rate of change decreases below a threshold, then a quasi-steady state condition may be determined. Absolute values for a threshold of changes in the outputs of the sensors is another example.

In step 850, this perturbation is done for each actuator. Each perturbation allows a determination of a column of G. In one aspect, each element of the column being computed is the ratio of the change in the output divided by the change in the input. If the output is temperature, the element of G has the units of temperature %, when the change to the input is defined as a %.

In step 860, G is calculated from the elements identified for each column of G. The calculation of the transfer matrix G would typically be done once, during commissioning. However, it may be repeated if the system needs to be re-commissioned because of a significant change to the load (e.g. the datacenter).

V. Example System to be Controlled

Figure 9:
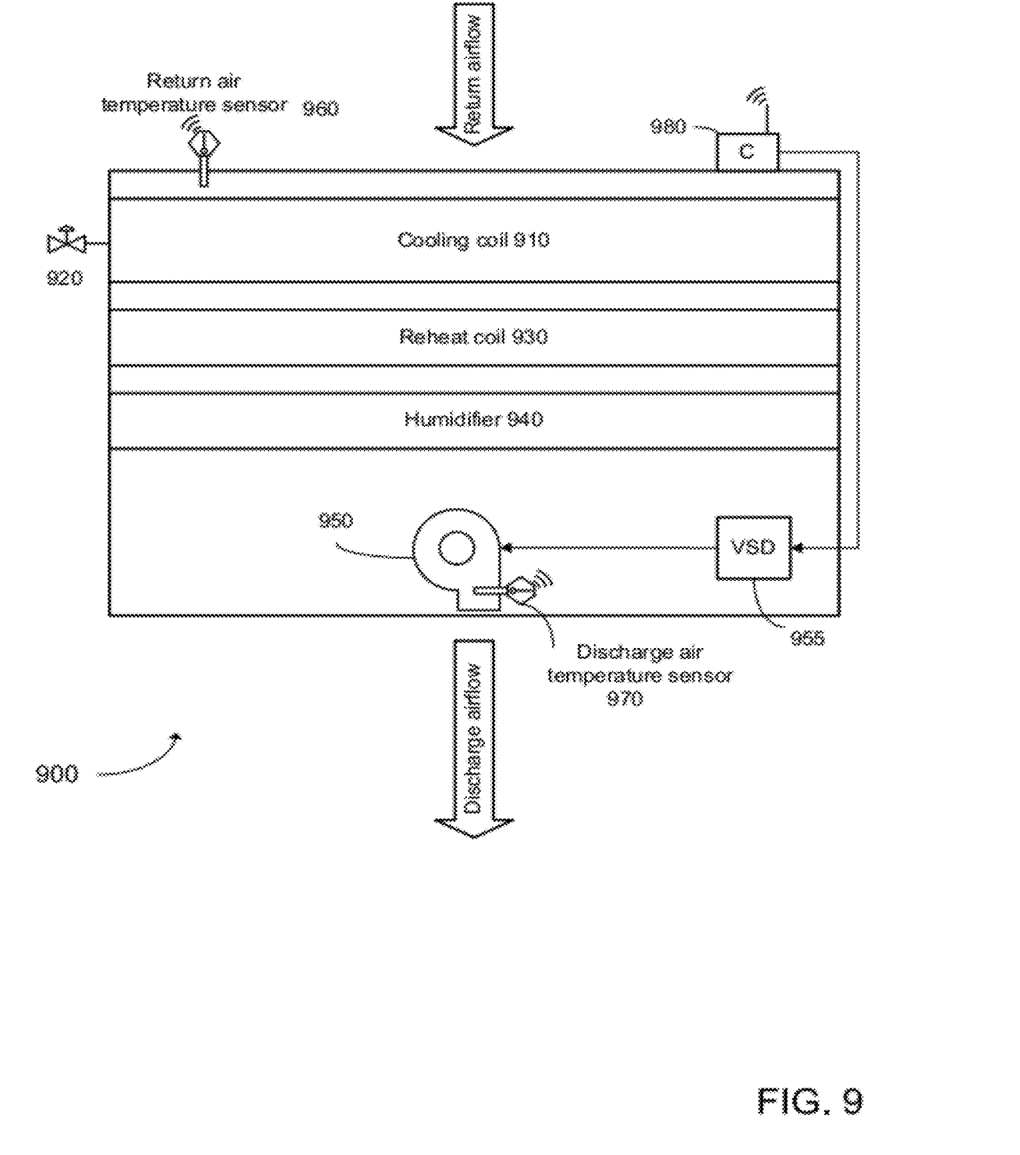
FIG. 9 is a schematic diagram of a computer room air handling unit 900 according to an embodiment of the present invention.

FIG. 9 is a schematic diagram of a computer room air handling unit 900 according to an embodiment of the present invention. The computer room air handling unit 900 has a cooling coil 910, which may contain chilled water modulated by a chilled water valve 920. The computer room air handling unit 900 also has a reheat coil 930, which may be an electric coil, and a humidifier 940, which may be an infrared humidifier.

In one embodiment, fan 950 is a centrifugal fan driven by an A/C induction motor. The induction motor may have a variable speed(frequency) drive VSD 955 for changing its speed. A wireless sensor 960 measures return air temperature, a wireless sensor 970 measures discharge air temperature, and a wireless control module 980 to control the VSD 955. The discharge air temperature sensor 970 and return air temperature sensors 960 may be probes tethered to the wireless control module rather than separate wireless sensors.

In embodiment of operation, the wireless sensors 960,970 send readings over the radio to a wireless network gateway, which passes the signals to a control computer, e.g. which contains supervisory controller 15 of FIG. 3. The control computer sends actuation commands to the wireless gateway, which relays the commands to the wireless control module 980, which changes the speed of the variable speed drive 955.

It should be apparent that various different modifications can be made to embodiments without departing from the scope and spirit of this disclosure. For instance, the invention can be adapted to operate a set of HVAC units that do not have embedded microprocessor-based controllers. In this embodiment, the supervisory controller would provide control commands directly to the final control elements of the HVAC units.

The specific details of the specific aspects of the present invention may be combined in any suitable manner without departing from the spirit and scope of embodiments of the invention. However, other embodiments of the invention may be directed to specific embodiments relating to each individual aspects, or specific combinations of these individual aspects.

It should be understood that the present invention as described above can be implemented in the form of control logic using computer software in a modular or integrated manner. Based on the disclosure and teachings provided herein, a person of ordinary skill in the art will know and appreciate other ways and/or methods to implement the present invention using hardware and a combination of hardware and software Any of the software components or functions described in this application, may be implemented as software code to be executed by a processor using any suitable computer language such as, for example, Java, C++ or Perl using, for example, conventional or object-oriented techniques. Computer programs incorporating features of the present invention may be encoded on various computer readable media for storage and/or transmission; suitable media include magnetic disk or tape, optical storage media such as compact disk (CD) or DVD (digital versatile disk), flash memory, and the like. The computer readable medium may be any combination of such storage or transmission devices.

Such programs may also be encoded and transmitted using carrier signals adapted for transmission via wired, optical, and/or wireless networks conforming to a variety of protocols, including the Internet. As such, a computer readable medium according to an embodiment of the present invention may be created using a data signal encoded with such programs. Computer readable media encoded with the program code may be packaged with a compatible device or provided separately from other devices (e.g., via Internet download). Any such computer readable medium may reside on or within a single computer program product (e.g. a hard drive or an entire computer system), and may be present on or within different computer program products within a system or network.

The above description of exemplary embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated.

What is claimed is:

1. A method of controlling a plurality of environmental maintenance modules of a system using a plurality of sensors, the method comprising:
    operating the system using first values of operational parameters for the environmental maintenance modules;
    receiving, at a supervisory controller of the system from a first subset of sensors of the plurality of sensors, a first set of environmental measurements, each environmental measurement being from a respective one of the first subset of sensors;
    receiving at the supervisory controller a first status indicator for a first of the plurality of environmental maintenance modules, the first status indicator distinct from the environmental measurements, wherein the first status indicator indicates an operational status of the first environmental maintenance module, the operational status comprising information related to whether the first environmental maintenance module is in an "on" or "off" state, or is in a failure mode, wherein the first status indicator indicates the first environmental maintenance module is in a failure mode;
    receiving a second status indicator for a second of the plurality of environmental maintenance modules, the second status indicator indicating that the second environmental maintenance module is in an "on" state;
    determining differences between the first set of environmental measurements and a plurality of reference values, each difference being between a respective environmental measurement and a corresponding reference value; and
    calculating an updated value for at least one operational parameter of the second of the environmental maintenance modules based on the first status indicator and at least one of the differences, wherein the first and second environmental maintenance modules are coupled to a common controlled space.

2. The method of claim 1, wherein the failure mode indicated by the first status indicator indicates the first environmental maintenance module is not working.

3. The method of claim 1, wherein the operational parameter of the second environmental maintenance module is one of a fan speed or a supply air temperature setpoint.

4. The method of claim 1, wherein the operational parameter of the second environmental maintenance module is a return air temperature setpoint.

5. The method of claim 1, wherein the operational parameter of the second environmental maintenance module is a chilled water valve position.

6. The method of claim 1, wherein the common controlled space is determined by a collection of values of a transfer function matrix, G, corresponding to the operational parameter of the environmental maintenance module, wherein the values in the collection of values of G are larger than values of G not in the collection.

7. The method of claim 1, further comprising:
    receiving, by the supervisory controller, a status indicator of a sensor; and
    using the status indicator of the sensor in calculating the value of the operational parameter of the second environmental maintenance module.

8. The method of claim 7 wherein the status indicator of the sensor indicates that the sensor has failed.

9. The method of claim 1, wherein at least one of the sensors is a temperature sensor.

10. The method of claim 1, wherein at least one of the sensors is a pressure sensor.

11. The method of claim 1, wherein the information provided in the operational status includes at least one of an operational level of the first environmental maintenance module, or a connection status between the first environmental maintenance module and the supervisory controller.

12. The method of claim 1, further comprising:
    setting to zero a parameter corresponding to the first status indicator into the calculation of the value for the operational parameter of the second of the environmental maintenance modules.

13. A system comprising:
    a plurality of environmental maintenance modules;
    a supervisory controller communicatively linked to the environmental maintenance modules;
    a plurality of sensors communicatively linked to the supervisory controller; and a memory comprising instructions which when executed cause the supervisory controller to:
operate the system using first values of operational parameters for the environmental maintenance modules;
receive from a first subset of the plurality of sensors a first set of environmental measurements, each environmental measurement being from a respective one of the first subset of sensors;
receive a first status indicator, distinct from any of the environmental measurements, from a first of the plurality of environmental maintenance modules;
identify an operational status of the first environmental maintenance module based on the first status indicator, the operational status comprising information related to whether the environmental maintenance module is in an "on" or "off" state or is in a failure mode, wherein the first status indicator indicates the first environmental maintenance module is in a failure mode;
receiving a second status indicator for a second of the plurality of environmental maintenance modules, the second status indicator indicating that the second environmental maintenance module is in an "on" state;
determine differences between the first set of environmental measurements and a plurality of reference values, each difference being between a respective environmental measurement and a corresponding reference value; and
calculate an updated value for at least one operational parameter of the second of the environmental maintenance-modules based on the first status indicator and at least one of the differences, wherein the first and second environmental maintenance modules are coupled to a common controlled space.

14. The system of claim 13, wherein the failure mode indicated by the first status indicator indicates the first environmental maintenance module is not working.

15. The system of claim 13, wherein at least one of the sensors is one of a pressure sensor or a temperature sensor.

16. A system of claim 13, wherein the operational parameter of the second environmental maintenance modules is one of a fan speed or a supply air temperature setpoint.

17. The system of claim 13, wherein the operational parameter of the second environmental maintenance modules is one of a chilled water valve, or a return air temperature setpoint.

18. The system of claim 13, wherein the calculation of the value of the operational parameter of the second environmental maintenance module uses M largest singular values of a transfer function matrix, G, M being a positive integer.

19. The system of claim 13, wherein the supervisory controller receives a status indicator of a sensor, and uses the status indicator of the sensor for calculating the value of the operational parameter of the second environmental maintenance module.

20. The system of claim 13, wherein the common controlled space is determined by a collection of values of a transfer function matrix, G, corresponding to the parameter of the environmental maintenance module, wherein the values in the collection of values of G are larger than the values of G not in the collection.

21. The system of claim 13, wherein the information provided in the operational status includes at least one of an operational level of the first environmental maintenance module, or a connection status between the first environmental maintenance module and the supervisory controller.

22. A method of controlling a plurality of environmental maintenance modules of a system using a plurality of sensors, the method comprising:
operating the system using first values of operational parameters for the environmental maintenance modules;
receiving, at a supervisory controller from a first subset of sensors of the plurality of sensors, a first set of environmental measurements, each environmental measurement being from a respective one of the first subset of sensors;
receiving at the supervisory controller a first status indicator for a first of the plurality of environmental maintenance modules, the first status indicator distinct from the environmental measurements, wherein the first status indicator indicates an operational status of the first environmental maintenance module, the operational status comprising information related to whether the first environmental maintenance module is working properly, wherein the first status indicator indicates the first environmental maintenance module is not working properly;
receiving a second status indicator for a second of the plurality of environmental maintenance modules, the second status indicator indicating that the second environmental maintenance module is in an "on" state;
determining differences between the first set of environmental measurements and a plurality of reference values, each difference being between a respective environmental measurement and a corresponding reference value; and
calculating an updated value for at least one operational parameter of a second of the environmental maintenance modules based on the first status indicator and at least one of the differences, wherein the first and second environmental maintenance modules are coupled to a common controlled space, and wherein the calculation sets to zero a parameter corresponding to the first status indicator when the first environmental maintenance module is not operating correctly.

23. The method of claim 22, wherein calculating the value for the operational parameter of the second of the environmental maintenance modules uses a transfer function matrix, G, wherein the transfer function matrix has one dimension being a total number of operational parameters of the environmental maintenance modules and the other dimension being the number of sensors.

24. The method of claim 23, wherein calculating the value for the operational parameter of the second of the environmental maintenance modules further uses M largest singular values of the transfer function matrix G.

25. The method of claim 24, further comprising:
modifying the transfer function matrix G using the status indicator before the M largest singular values are determined.

* * * * *